(12) United States Patent
Howe et al.

(10) Patent No.: US 11,979,165 B1
(45) Date of Patent: May 7, 2024

(54) FREQUENCY MULTIPLIER CIRCUIT WITH PROGRAMMABLE FREQUENCY TRANSITION CONTROLLER

(71) Applicant: Movellus Circuits Incorporated, Ann Arbor, MI (US)

(72) Inventors: Scott Howe, Ontario (CA); Xiao Wu, Ann Arbor, MI (US); Jeffrey Alan Fredenburg, Chicago, IL (US)

(73) Assignee: Movellus Circuits Inc., Ann Arbor, MI (US)

( * ) Notice: Subject to any disclaimer, the term of this patent is extended or adjusted under 35 U.S.C. 154(b) by 0 days.

(21) Appl. No.: 17/989,458

(22) Filed: Nov. 17, 2022

(51) Int. Cl.
*H03L 7/185* (2006.01)

(52) U.S. Cl.
CPC .................. *H03L 7/185* (2013.01)

(58) Field of Classification Search
CPC . H03L 7/06; H03L 7/08; H03L 7/0805; H03L 7/0807; H03L 7/081; H03L 7/085; H03L 2207/00

See application file for complete search history.

(56) References Cited

U.S. PATENT DOCUMENTS

| | | | |
|---|---|---|---|
| 5,999,060 A | 12/1999 | Zuta | |
| 6,072,842 A | 6/2000 | Janesch | |
| 6,218,876 B1 | 4/2001 | Sung | |
| 6,275,553 B1 | 8/2001 | Esaki | |
| 6,424,192 B1 | 7/2002 | Lee | |
| 6,496,965 B1 | 12/2002 | van Ginneken | |
| 6,744,324 B1 | 6/2004 | Adams | |
| 6,826,247 B1 | 11/2004 | Elliott | |
| 7,216,249 B2 | 5/2007 | Fujiwara | |
| 8,117,576 B2 | 2/2012 | Mossawir | |
| 8,321,489 B2 | 11/2012 | Staszewski | |
| 8,427,205 B1 | 4/2013 | Nagaraj | |
| 8,791,734 B1 | 7/2014 | Hara | |
| 9,007,109 B2 | 4/2015 | Ba | |
| 9,337,850 B2 * | 5/2016 | Moehlmann | H03L 7/099 |
| 9,537,493 B2 * | 1/2017 | Balachandran | H03L 7/093 |
| 9,698,798 B1 | 7/2017 | Fredenburg | |
| 2005/0189972 A1 | 9/2005 | Foo | |
| 2007/0085622 A1 | 4/2007 | Wallberg | |
| 2010/0073048 A1 | 3/2010 | He-Ling-Wei | |

(Continued)

*Primary Examiner* — Diana J. Cheng
(74) *Attorney, Agent, or Firm* — Lance Kreisman; Peninsula Patent Group

(57) ABSTRACT

A frequency multiplier circuit includes a first multiplier circuit to generate a first digital value representing a received reference signal having a reference frequency and reference phase, the multiplier circuit to multiply the first digital value by a multiplier value. Comparison circuitry compares the first digital value to an output digital value representing an output signal having an output frequency and an output phase, the comparison circuitry to generate an error signal based on the comparison. A programmable loop filter generates a control signal based at least in part on the error signal. A frequency generation circuit produces the output signal having the output frequency and phase. A phase-to-digital converter generates and feeds the output digital value to the phase comparison circuitry. A programmable transition controller controls a transitioning frequency relationship between a first signal frequency of a first locked output signal and a desired second signal frequency.

20 Claims, 11 Drawing Sheets

(56) References Cited

U.S. PATENT DOCUMENTS

| | | |
|---|---|---|
| 2010/0244971 A1 | 9/2010 | Wang |
| 2013/0120036 A1 | 5/2013 | Zhu |
| 2013/0300477 A1 | 11/2013 | Ueda |
| 2016/0036454 A1 | 2/2016 | Moehlmann |
| 2016/0204787 A1 | 7/2016 | Lotfy |
| 2017/0193136 A1 | 7/2017 | Prasad |
| 2020/0076439 A1 | 3/2020 | Weeks |

* cited by examiner

FREQUENCY MULTIPLIER CIRCUIT WITH PROGRAMMABLE FREQUENCY TRANSITION CONTROLLER

TECHNICAL FIELD

The disclosure herein relates to digital systems, subsystems, integrated circuits, and associated methods.

BACKGROUND

Many systems optimize for power and performance using dynamic voltage and frequency scaling (DVFS). DVFS is a technique for adjusting the frequency and voltage of a system in response to varying workloads. During periods of low activity, the system frequency and voltage are both lowered to conserve power, and during peak activity, the frequency and voltage are both raised to increase performance. The use of DVFS allows systems to dynamically scale power consumption and achieve an overall higher operating efficiency over their lifetime.

While having the ability to dynamically scale power consumption and achieve higher efficiency works well for most circumstances, abrupt changes in the clock frequency may cause undesirable disruptions to the system. If the clock frequency is increased too quickly, the supply voltage can undershoot due to the sudden increase in load current. Similarly, the supply voltage can overshoot when the clock frequency is decreased too quickly due a sudden decrease in load current. In many cases, these perturbations may cause timing failures within the system and render it unusable until the supply voltage settles.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Digital systems, subsystems, integrated circuits, and associated methods are disclosed. In one embodiment, a frequency multiplier circuit is disclosed. The frequency multiplier circuit includes a first multiplier circuit to generate a first digital value representing a received reference signal having a reference frequency and reference phase, the multiplier circuit to multiply the first digital value by a multiplier value. Comparison circuitry compares the first digital value to an output digital value representing an output signal having an output frequency and an output phase, the comparison circuitry to generate an error signal based on the comparison. A programmable loop filter generates a control signal based at least in part on the error signal. A frequency generation circuit produces the output signal having the output frequency and phase. A phase-to-digital converter generates and feeds the output digital value to the phase comparison circuitry. A programmable transition controller controls a transitioning frequency relationship between a first signal frequency of a first locked output signal and a desired second signal frequency. By controlling the transitioning frequency relationship between a first signal frequency of a first locked output signal and a desired second signal frequency, device perturbations may be reduced during operation when frequencies are changed, improving system settling time and performance.

Figure 1:
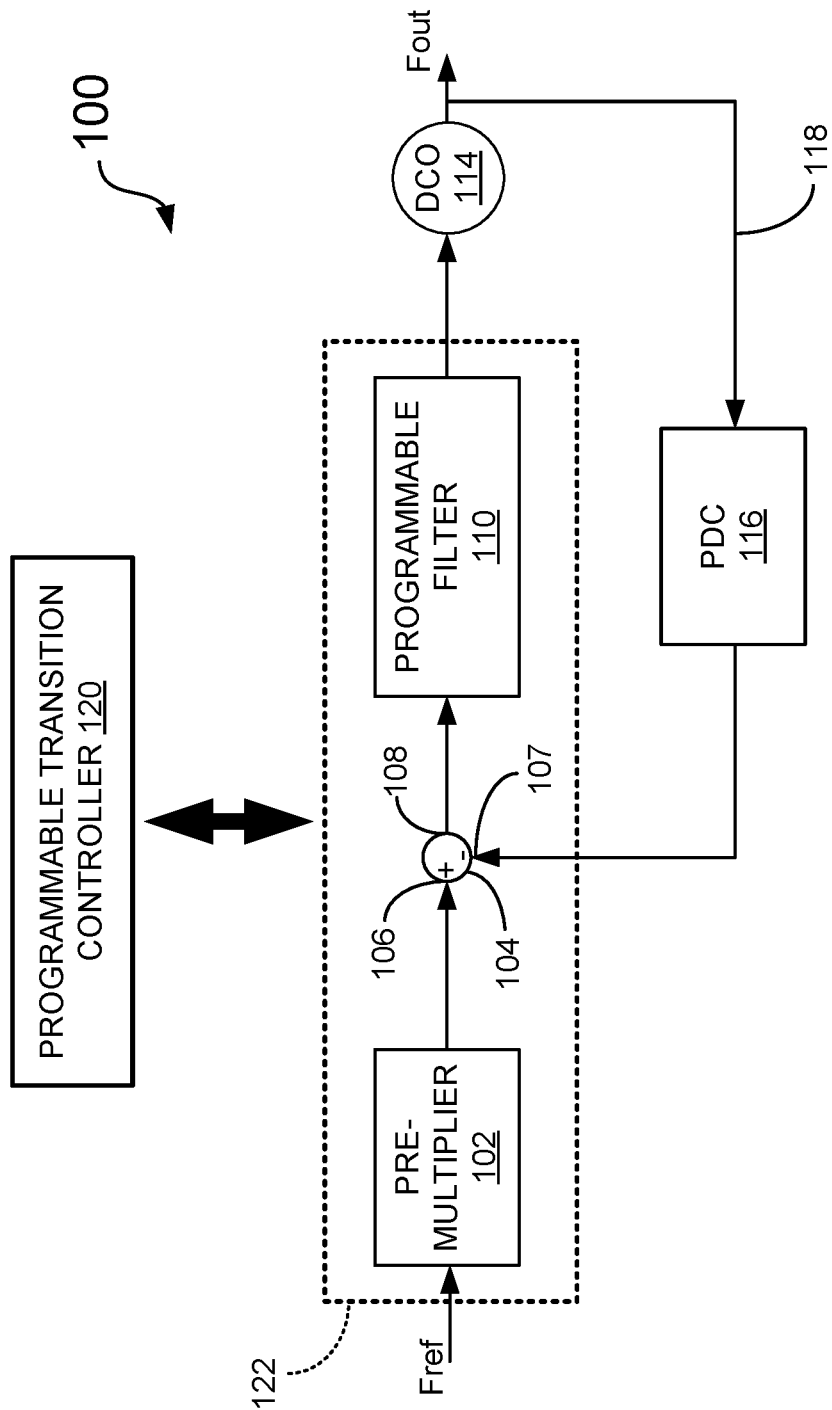
FIG. 1 illustrates a generic embodiment of a clock generation circuit in the form of a phase-locked loop (PLL) circuit that includes a programmable transition controller.

FIG. 1 illustrates one embodiment of a frequency multiplier circuit 100. The frequency multiplier circuit 100 includes a pre-multiplier circuit 102 to receive a reference signal Fref (such as a reference clock signal) having a reference frequency and phase. The pre-multiplier circuit 102 generates a first digital value representing the received reference signal Fref, multiplies the first digital value by a multiplier value, and feeds the multiplied result as an input digital value to a digital subtractor circuit 104.

Further referring to FIG. 1, for one embodiment, the digital subtractor circuit 104 serves as a phase comparator and includes a first input, at 106, to receive the input digital value from the pre-multiplier circuit 102, and a second input, at 107, to receive an output digital value representing an output signal with an output frequency Fout and phase generated by the overall frequency multiplier circuit 100. The digital subtractor circuit 104 generates an error signal, at 108, by subtracting the output digital value from the input digital value.

Further referring to FIG. 1, a programmable loop filter 110 receives the error signal from the digital subtractor circuit 104 and generates a control signal for application to a frequency generation circuit 114, such as a digitally controlled oscillator (DCO). Based on the value of the control signal, the DCO 114 generates the output signal Fout having the output frequency Fout and phase. A phase-to-digital converter (PDC) 116 receives the output signal Fout along a feedback path 118, converts the output signal Fout to the digital output signal, and feeds the digital output signal to the digital subtractor circuit 104.

In an effort to minimize perturbations and/or other undesirable transient effects resulting from changes between operating frequencies, the frequency multiplier circuit 100 employs programmable transition control circuitry 120 to controllably ramp the output signal from a first frequency and phase to a second frequency and phase. In some embodiments, the controlled ramp from the first frequency and phase to the second frequency and phase is carried out in a linear transitioning frequency relationship between the first frequency and phase and the desired second frequency and phase. For one embodiment, the programmable transition control circuitry 120 couples to a forward path 122 of the frequency multiplier circuit 100, which includes the pre-multiplier circuit 102, the subtractor circuit 104, and the programmable loop filter 110. Various embodiments described below provide alternative configurations for the programmable transition control circuitry 120 and how the various embodiments connect to the various portions of the forward path 122 of the frequency multiplier circuit 100.

Figure 2:
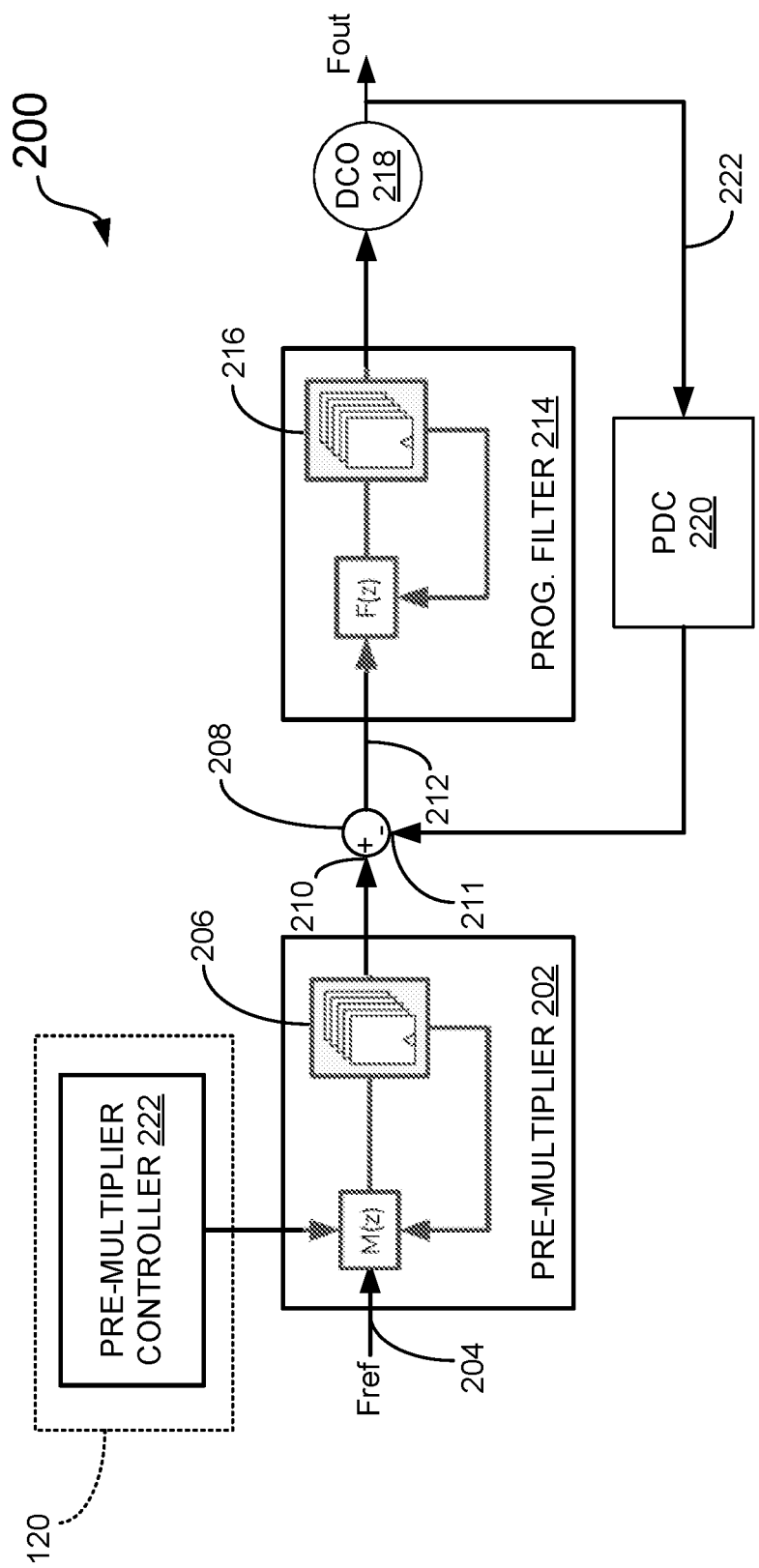
FIG. 2 illustrates further details for one specific embodiment of the PLL circuit of FIG. 1.

With reference to FIG. 2, one specific embodiment of a frequency multiplier circuit 200 is illustrated that is similar to the frequency multiplier circuit 100 of FIG. 1. The frequency multiplier circuit 200 includes a pre-multiplier circuit 202 having a reference input, at 204, to receive a reference signal (such as a reference clock signal) having a reference frequency Fref and phase. The pre-multiplier circuit 202 applies a transfer function multiplier M(z) to the reference signal and generates a digital representation of the multiplied reference signal as an input digital value. Register storage 206 stores the input digital value and provides the input digital value to a digital subtractor circuit 208.

Further referring to FIG. 2, for one embodiment, the digital subtractor circuit 208 serves as a phase comparator and includes a first input, at 210, to receive the input digital value from the pre-multiplier circuit 202, and a second input, at 211, to receive an output digital value representing an output signal with an output frequency Fout and phase generated by the overall frequency multiplier circuit 200. The digital subtractor circuit 208 generates an error signal, at 212, by subtracting the output digital value from the input digital value.

Further referring to FIG. 2, a programmable loop filter 214 receives the error signal from the digital subtractor circuit 208. The programmable loop filter 214 processes the error signal based on a programmed filter transfer function, F(z), and stores the processed value within storage 216. The processed value is used as an active control signal for a frequency generation circuit 218, such as a digitally controlled oscillator (DCO).

With continued reference to FIG. 2, the DCO 218 generates the output signal Fout having the output frequency Fout and phase. A phase-to-digital converter (PDC) 220 receives the output signal Fout along a feedback path 222, converts the output signal Fout to the digital output signal, and feeds the digital output signal to the digital subtractor circuit 208.

Figure 3:
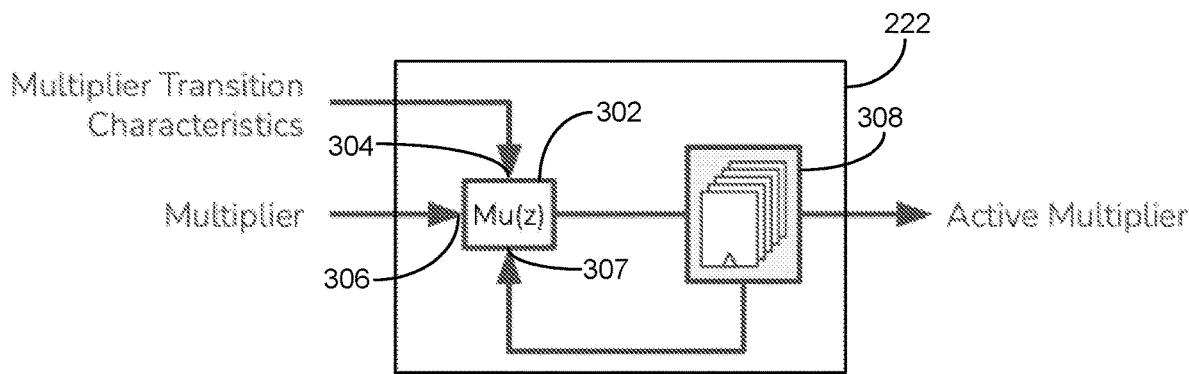
FIG. 3 illustrates one embodiment of the pre-multiplier controller of FIG. 2.

Further referring to FIG. 2, for one embodiment, the frequency multiplier circuit 200 employs the programmable transition circuitry 120 of FIG. 1 in the form of a pre-multiplier controller 222 that is coupled to the pre-multiplier circuit 202. FIG. 3 illustrates one embodiment of the pre-multiplier controller 222, with multiplier update circuitry 302 that exhibits a multiplier update function Mu(z). The multiplier update circuitry 302 includes a first input, at 304, to receive a programmed set of multiplier transition characteristics, a second input at 306, to receive a target multiplier value Multiplier, and a third input at 307 to receive a current value of a generated active multiplier value, stored by storage 308, that is applied to the pre-multiplier circuit 202. The multiplier update function Mu(z), which determines the shape of the frequency transition, can consist of a reconfigurable lookup table, or a programmable algorithm such as a programmable infinite impulse response (IIR) filter where configuration and programming values are provided through the programming signals, Multiplier Transition Characteristics.

In operation, the pre-multiplier controller 222 enables programmable frequency transitions by continuously updating the multiplication ratio between the reference frequency and phase, Fref, and the output frequency and phase, Fout, through updates to the pre-multiplier circuit transfer function M(z). For some embodiments, the pre-multiplier transfer function M(z) can be updated on reference frequency clock edges. To generate a linear ramp frequency transition, for instance, the transfer function, M(z), which determines the active multiplier, typical referred to as N when constant, is linearly increased at each reference frequency clock edge so that the ratio between the reference frequency and phase, Fref, and the output frequency and phase, Fout, tracks a linear ramp. Furthermore, to generate other arbitrary transitions, the transfer function, M(z), is updated to produce a time-varying multiplier that maps the desired frequency transition behavior.

Figure 4:
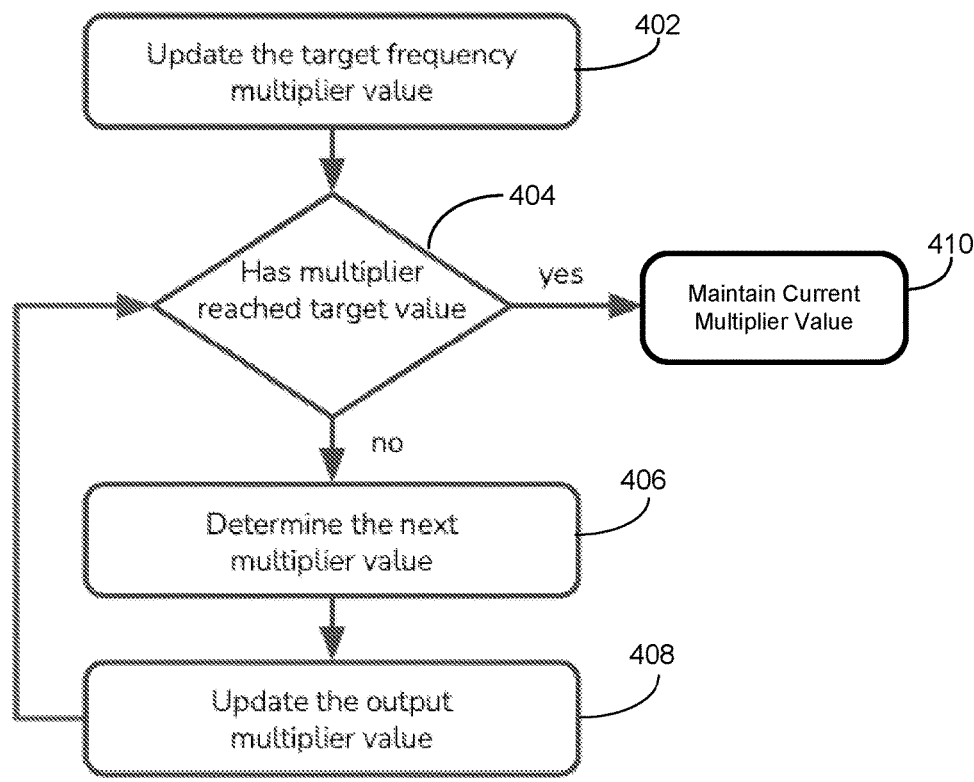
FIG. 4 illustrates method steps for operation of the pre-multiplier controller of FIG. 3.

FIG. 4 illustrates one embodiment of steps employed by the pre-multiplier controller 222 during operation. At 402, the pre-multiplier controller 222 updates the target frequency multiplier value. The updated target frequency multiplier value indicates the next frequency multiplication ratio to which the frequency multiplier circuit 200 will lock. Upon receiving a new target multiplier value, the pre-multiplier controller 222 will determine whether the current multiplier value is equal to the target multiplier value, at 404. If the values are not equal, the next multiplier value is determined, at 406, based on the current multiplier value, the target multiple value, and the programmed transition characteristics. The output value is then updated, at 408, with the newly determined value, and the output multiplier value is again compared to the target multiplier value, at 404. If the values are equal, the pre-multiplier maintains the current multiplier value, at 410, and subsequently, the frequency multiplier circuit will maintain the updated frequency multiplication ratio.

Figure 5:
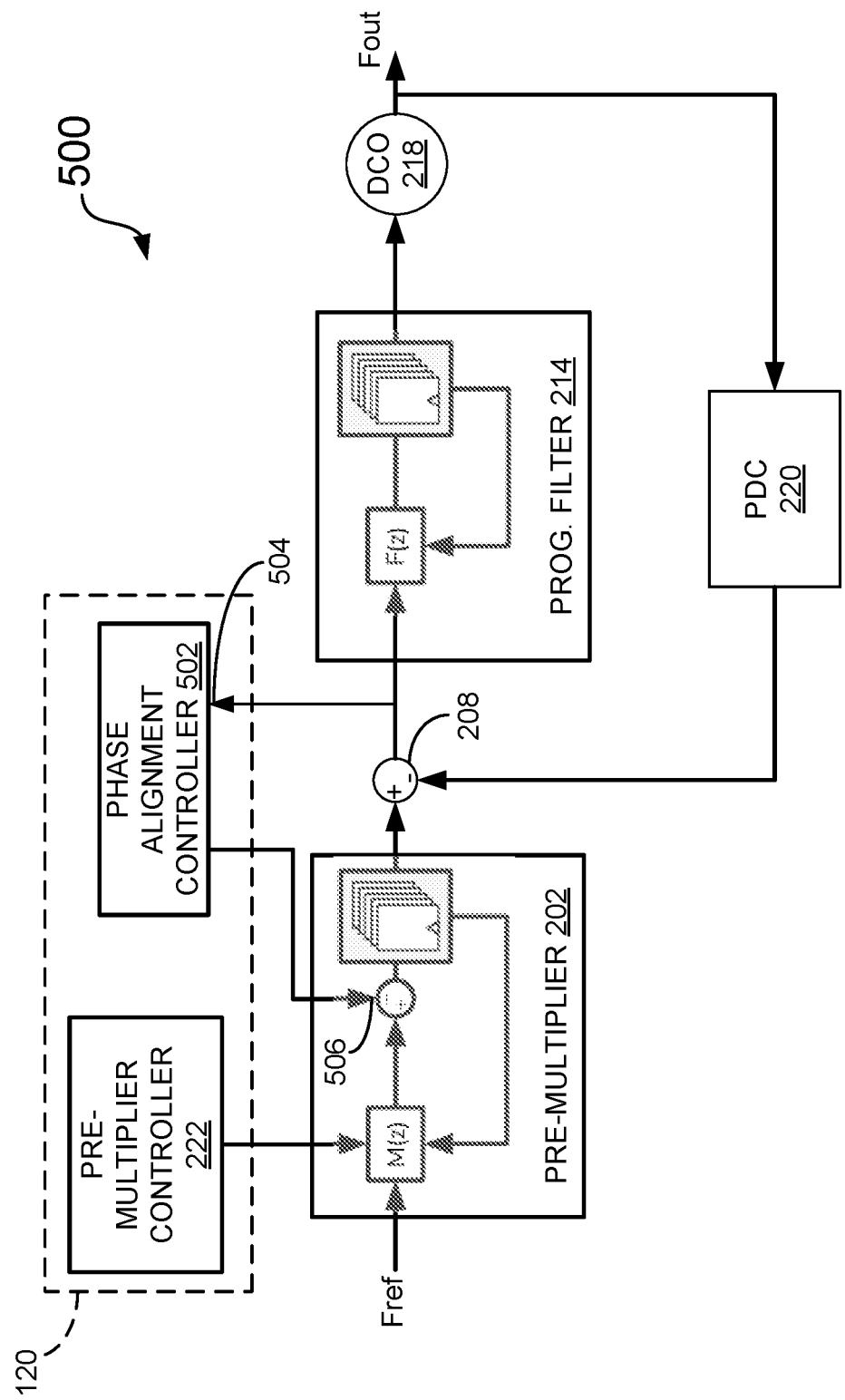
FIG. 5 illustrates further details for a second specific embodiment of the PLL circuit of FIG. 1.

FIG. 5 illustrates a further embodiment of a frequency multiplier circuit 500, that employs all of the circuitry of the frequency multiplier circuit 200 of the previously-described embodiment, but adds additional features to the programmable transition controller 120. To address any phase offsets possibly caused by processing of the error signal in the programmable loop filter 214, the programmable transition controller includes a phase alignment controller 502 to continuously correct the phase offset between the pre-multiplied digital representation of the reference frequency and phase and the digital representation of the output frequency and phase, Fout.

Figure 6:
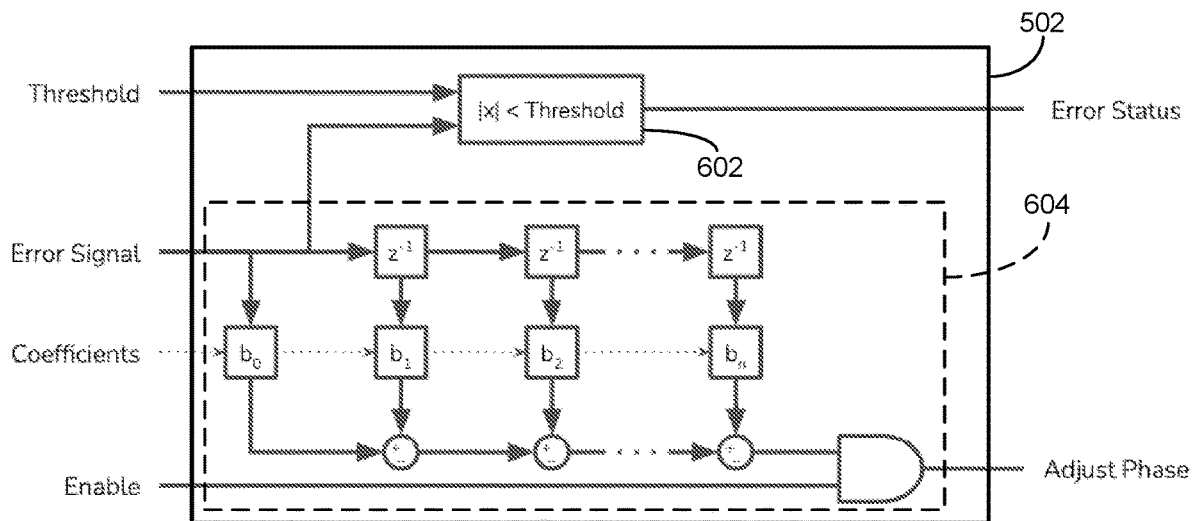
FIG. 6 illustrates one embodiment of the phase alignment controller of FIG. 5.

Further referring to FIG. 5, the phase alignment controller 502 includes a first input, at 504, to receive the error signal produced by the digital subtractor circuit 208. After processing the error signal, the phase alignment controller 502 applies a phase compensation signal to the updated multiplier value, at 506, to eliminate the phase offset. FIG. 6 illustrates further detail for one embodiment of the phase alignment controller 502, including a threshold measurement circuit 602 that returns a status signal, Error Status, indicating whether the error signal is bounded within a programmable threshold value, Threshold. A programmable filter circuit 604, such as a finite impulse response (FIR) filter, includes programmable filter weights, Coefficients, $b_0$-$b_n$, that process an input signal, Error Signal, and generate an output signal, Adjust Phase. For one embodiment, an enable signal, Enable, drives the output signal, Adjust Phase, to zero when the phase alignment controller 502 is not in use.

For one embodiment, the phase alignment capability of the phase alignment controller 502 is carried out by injecting a portion of the error signal back into the pre-multiplied digital representation of the reference frequency and phase. On every comparison clock edge, a portion of the previous phase difference is zeroed out between the pre-multiplied digital representation of the reference frequency and phase and the digital representation of the output frequency and phase. When the transition is complete, the phase difference will approach zero, so the system will not need to overshoot the output frequency to align the phases. The phase alignment controller provides a mechanism for eliminating overshoot and undershoot at the final frequency and phase value during programmed frequency transitions.

Figure 7:
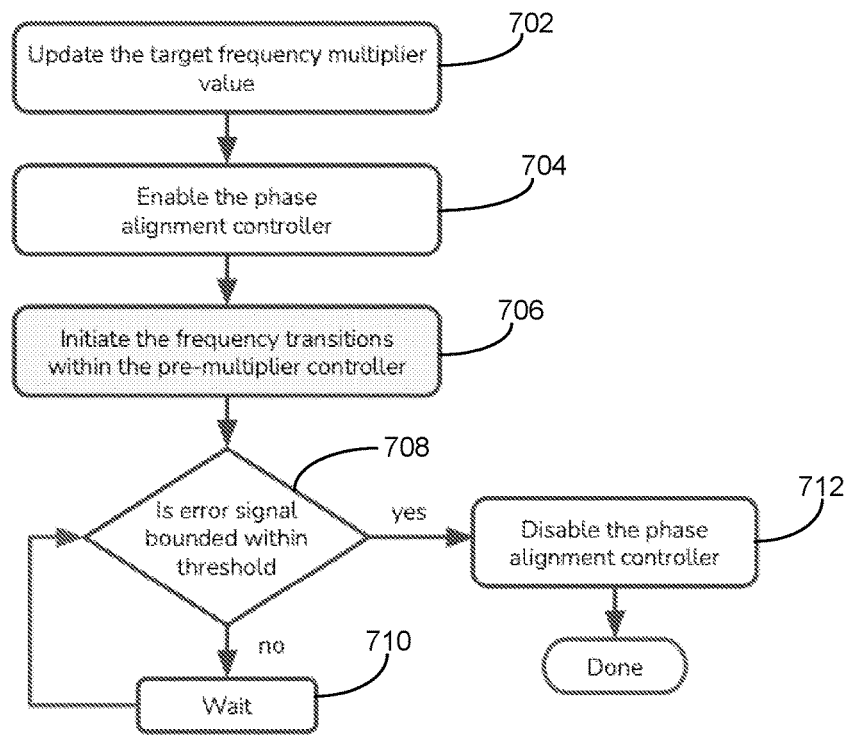
FIG. 7 illustrates method steps for operation of the PLL circuit of FIG. 5 utilizing the pre-multiplier controller and the phase alignment controller of FIG. 5.

FIG. 7 illustrates one embodiment of steps employed by the phase alignment controller 502 during operation in concert with the pre-multiplier controller 222. At 702, the target frequency multiplier to the programmable transition controller 120 is updated. Upon recognizing a change in the target frequency multiplier, the phase alignment controller 502 is activated, at 704, and uses the programmed filter coefficients to calculate the phase adjustment value, Phase Adjust. The pre-multiplier controller 222 is next activated, at 706, by updating the target multiplier value presented to the pre-multiplier controller 202, which causes the pre-multiplier controller iterate over the sequence of multiplier values based on the programmed transition characteristics, Multiplier Transition Characteristics. When the pre-multiplier has reached the desired target multiplier, the pre-multiplier controller 202 will maintain the updated target frequency multiplier value. As the pre-multiplier control value is held constant, the loop will begin to stabilize, which drives the error toward zero, so the programmable transition controller can begin monitoring the error signal. If the error signal is outside the programmed threshold, at 708, the programmable transition controller 120 will wait, at 710, and continue to measure the error signal. If the error signal is sufficiently bounded within the programmed threshold, the programmable transition controller will disable the phase alignment controller, at 712, which restores control back to the core frequency multiplier circuit 500.

Figure 8:
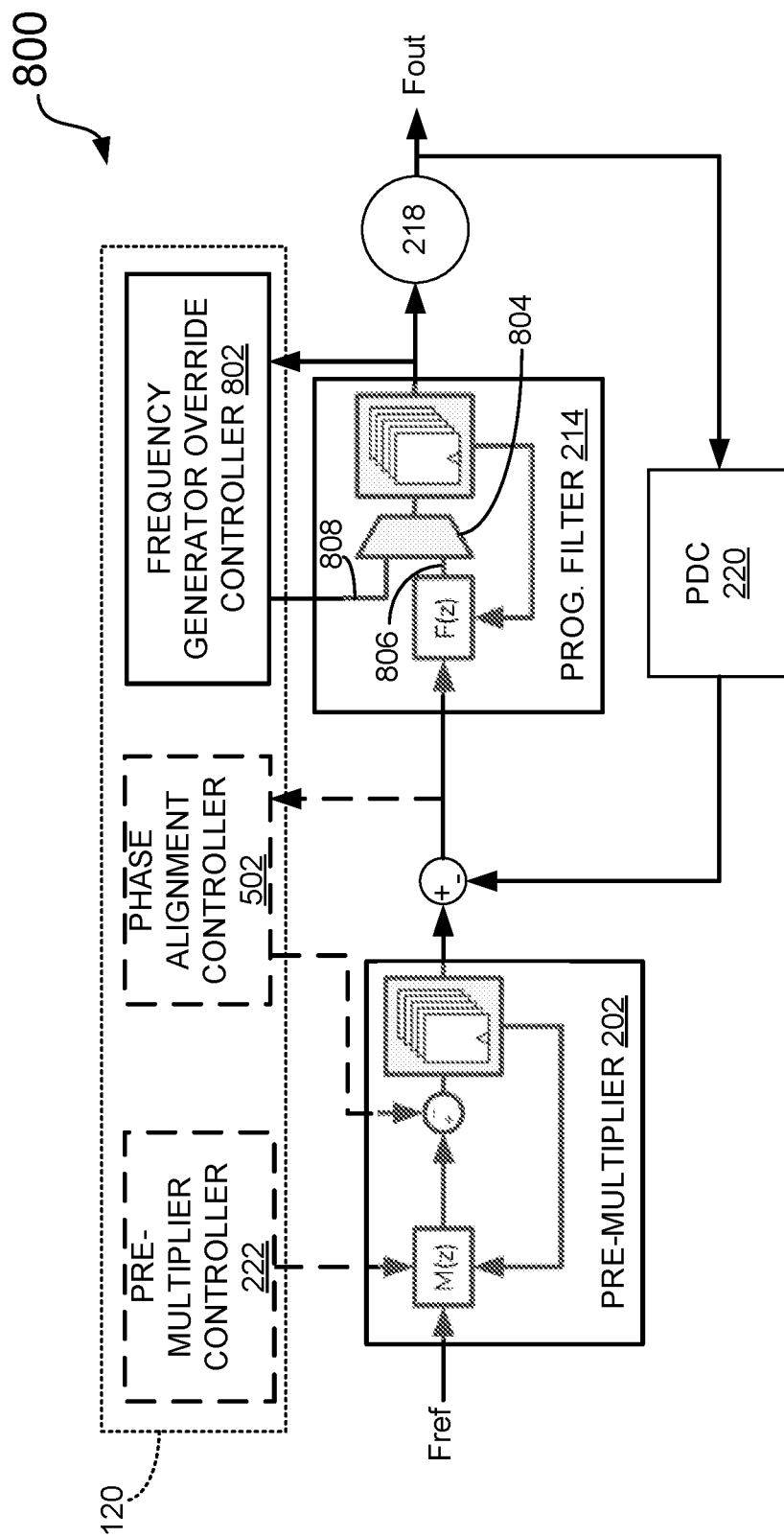
FIG. 8 illustrates a third embodiment of the PLL circuit of FIG. 1.

FIG. 8 illustrates a further embodiment of a frequency multiplier circuit 800, that is similar to the previously-described embodiments, but includes a frequency generator override controller 802 in the programmable transition controller 120. In some embodiments, one or more of the pre-multiplier controller 222 and the phase alignment controller 502 may optionally be combined with the frequency generator override controller 802. The frequency generator override controller 802 continuously updates the control signal supplied to the frequency generation circuit by the programmable loop filter 214. For one embodiment, the programmable loop filter 214 includes a selector circuit 804, in response to a selection signal, that overrides the control signal generated by the programmable loop filter circuit 214, at 806, with an override control signal supplied at 808. The frequency generation override controller 802 then sequences override control values as-needed to generate a desired linear ramp frequency transition.

Figure 9:
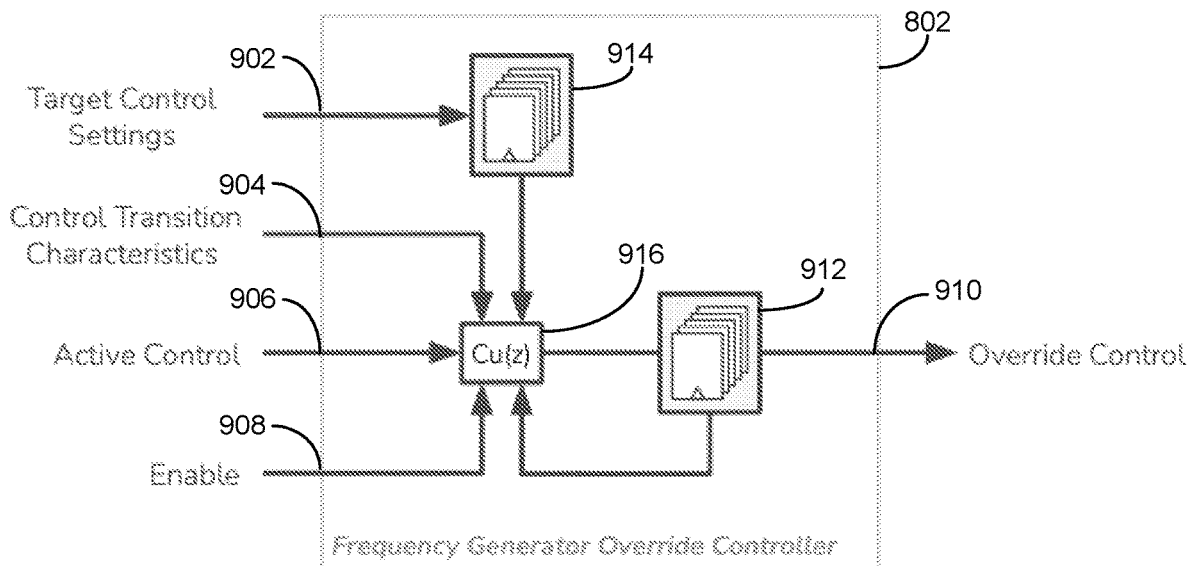
FIG. 9 illustrates one embodiment of the frequency generator override controller of FIG. 8.

One detailed embodiment of the frequency generator override controller 802 is illustrated in FIG. 9. For one embodiment, the frequency generator override controller includes a plurality of inputs to receive target control settings, at 902, control transition characteristics, at 904, an active control signal, at 906, and an enable signal, at 908. An output, at 910, provides an override control signal Override Control. In some embodiments, register storage stores the override value, at 912, and settings related to the target control value, at 914. A control value update function, Cu(z), at 916, calculates a next control signal value from the current frequency generation circuit control signal value, Active Control, the override signal value, Override Control, the target control settings, Target Control Settings, the programmed control signal transition characteristics, Control Transition Characteristics, and the enable signal, Enable.

Further referring to FIG. 9, the frequency generator override controller 802 generates a sequence of override control signal values, Override Control, that can be used to drive the frequency generation circuitry. When enabled, the frequency generator override controller 802 relies on the control signal update function, Cu(z), to generate the sequence of override control signal values, Override Control, from the current frequency generation circuit control signal value, Active Control, the override signal value, Override Control, the target control settings, Target Control Settings, and the programmed control signal transition characteristics, Control Transition Characteristics. The control signal update function Cu(z), which determines the shape of the signal transition leading to the target control value, can consist of a reconfigurable lookup table or a programmable algorithm such as a programmable infinite impulse response (IIR) filter where the configuration and programming values are provided through the programming signals, Control Transition Characteristics and Target Control Settings. Once the override control signal value has reached the target value, the control signal update function Cu(z) will maintain the output value, Override Control, at the target value. For some embodiments, the target control signal value may be derived from the programmed settings of the target control value, Target Control Settings. The programming settings, Target Control Settings, can express the target control signal value itself, a ratio of the original frequency generation circuit control signal value, an offset from the original frequency generation circuit control signal value, etc. When disabled, the frequency generator override controller 802 may mirror the frequency generation circuitry control signal value, Active Control, at the output, Override Control, so that the control signal does not change when transitioning from the disable state to the enable state.

Figure 10:
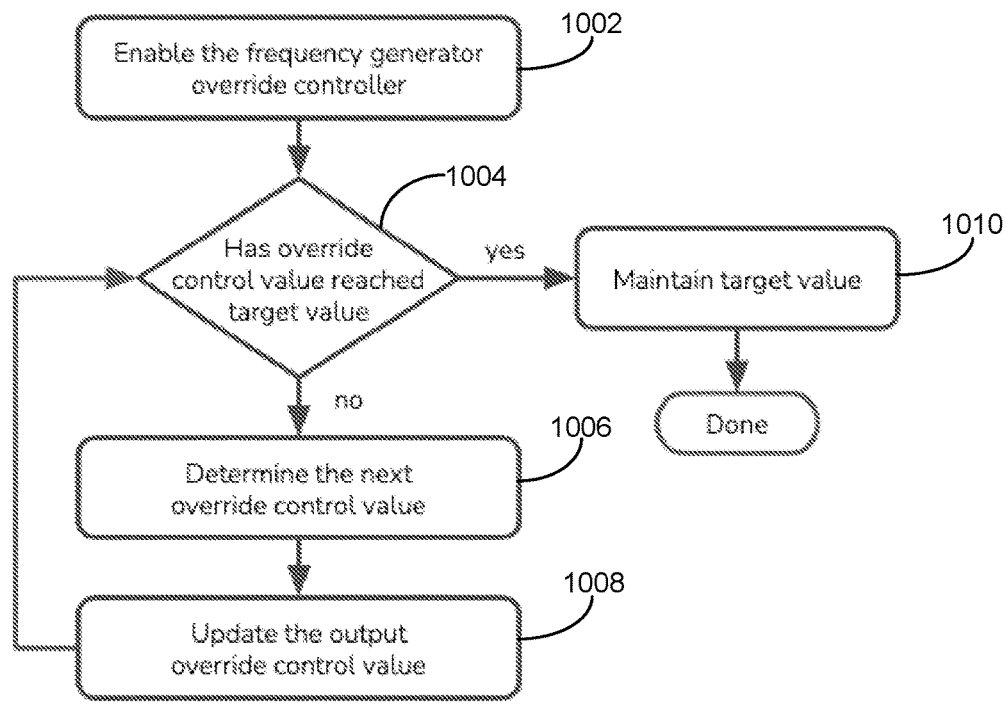
FIG. 10 illustrates method steps for operation of the PLL circuit of FIG. 8 utilizing the frequency generator override controller of FIG. 8.

FIG. 10 illustrates steps carried out by one embodiment of the frequency generator override circuit 802 when operating in a frequency multiplier circuit that does not include (or enable) the per-multiplier controller 222 or the phase alignment controller 502. At 1002, the frequency generator override controller 802 is enabled. Upon receiving the enable signal, the frequency generator override controller 802 determines, at 1004, whether the current override control value is equal to the target override control value. If the values are not equal, the next override control value is determined, at 1006, based on the current override control value, the target override control value, and the programmed transition characteristics. The output value is then updated with a new value, at 1008, and the output override control value is again compared to the target override control value, at 1004. If the values are equal, the frequency generator override controller 802 maintains the target override control value, at 1010, so that the frequency generation circuitry is driven with a constant control value. The target control signal value may be derived from the programmed settings of the target control value, Target Control Settings, which can express the target control signal value itself, a ratio of the original frequency generation circuit control signal value, an offset from the original frequency generation circuit control signal value, and other parameters depending on the application.

Figure 11:
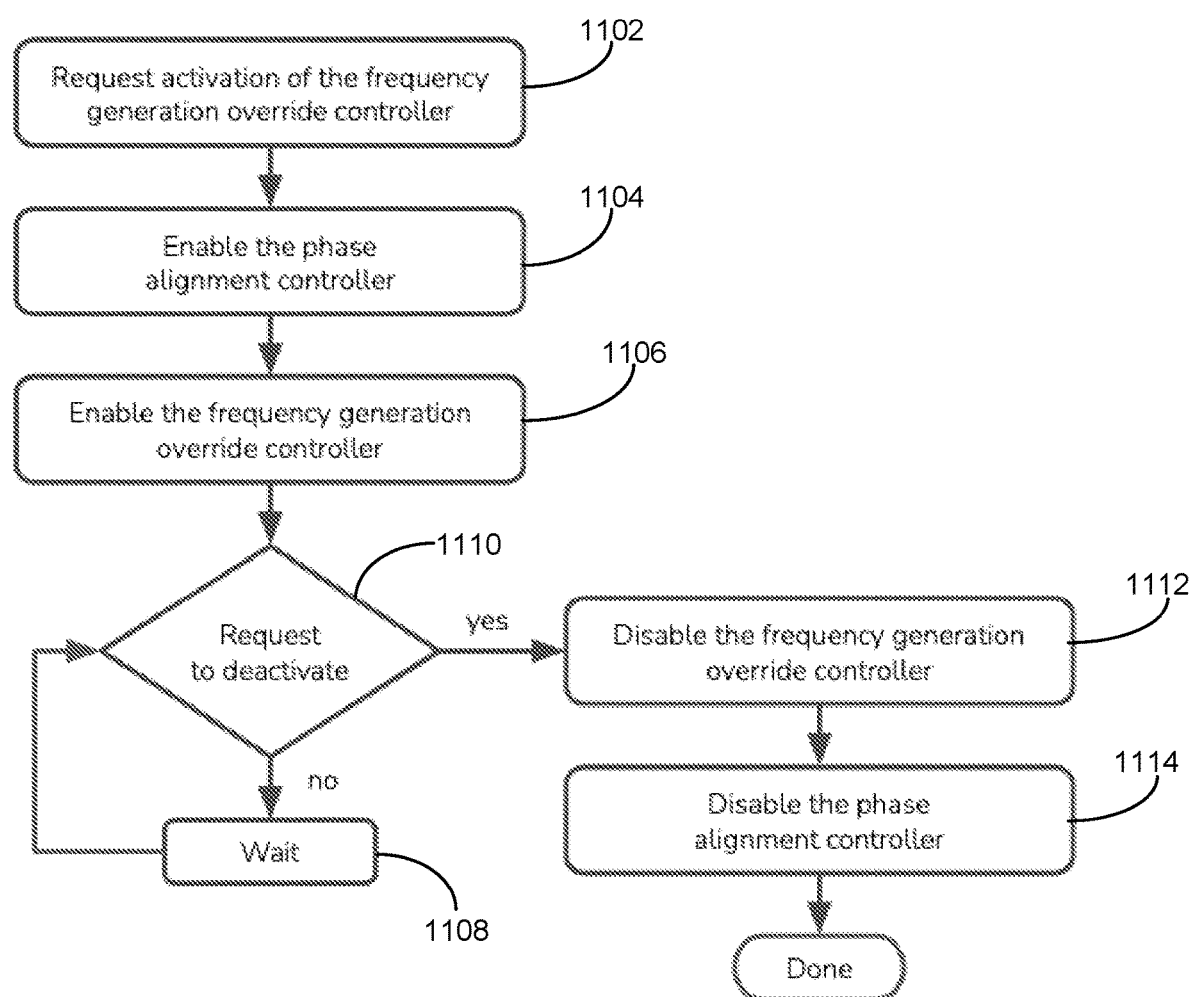
FIG. 11 illustrates method steps for operation of the PLL circuit of FIG. 8 utilizing the frequency generator override controller and the phase alignment controller of FIG. 8.

As noted above, in some situations the frequency multiplier circuit 800 may combine the frequency generator override circuit 802 with one or both of the pre-multiplier controller 222 and/or the phase alignment controller 502. FIG. 11 illustrates steps involved during operation of a frequency multiplier circuit that employs a programmable transition controller 120 that includes both a frequency generator override controller 802 and a phase alignment controller 502. At 1102, activation of the frequency override controller 802 is requested. This request may be sent, for example, through programming settings or control pins. Upon receiving the request to activate the frequency generation override controller 802, both the phase alignment controller 502 and the frequency generation override controller 802 are enabled, at 1104 and 1106. The frequency generation override controller 802 will then iterate over the sequence of override control values using both the control transition settings and the target control settings to determine the sequence values. The phase alignment controller 502 will use the programmed filter settings, Coefficients, to determine how to inject the active error back into the pre-multiplier circuit 202. After the frequency generation override controller 802 has reached the target override value, the frequency generation override controller 802 will wait, at 1108, until receiving a request to deactivate, at 1110, after which both the frequency generation override controller and the phase alignment controller are disabled, at 1112 and 1114. Once both the frequency generation override controller 802 and the phase alignment controller 502 are disabled, the core frequency multiplier circuit will resume normal operation and will drive the output frequency back to the multiplication ratio set within the pre-multiplier.

Thus, for an embodiment where the frequency multiplier circuit 800 employs a programmable transition controller 120 that includes both a frequency generator override controller 802 and a phase alignment controller 502, certain performance improvements are realized. While the frequency generator override controller 802 enables programmable frequency transitions by continuously updating the active control signals driving the frequency generation circuit such as a digitally controlled oscillator, during operation, the loop will continue to process the error signal generated by the subtractor comparing the pre-multiplied digital representation of the reference frequency and phase to the digital representation of the output frequency and phase. If the frequency generator override controller 802 is active for many reference periods, the programmable filter can accumulate too much error and may need many reference periods to unwind that accumulated error. If too much error is accumulated, the control signal supplied by the programmable filter when frequency generator override controller may completely saturate the frequency generation circuitry rendering the output frequency and phase unusable until the system recovers.

To address the saturation, the phase alignment controller 502 continuously corrects the phase offset between the pre-multiplied digital representation of the reference frequency and phase and the digital representation of the output frequency and phase, Fout, by injecting a portion of the error signal back into the pre-multiplied digital representation of the reference frequency and phase. On every comparison clock edge, a portion of the previous phase difference, up to and including the entire error, is zeroed out between the pre-multiplied digital representation of the reference frequency and phase and the digital representation of the output frequency and phase. When the transition is complete, the phase difference will approach zero, so the system will not need to unwind any excessive accumulated error. For some embodiments, the phase alignment controller 502 may not completely prevent overshoot and undershoot during recovery but may prevent the accumulation of error over reference clock periods that will saturate the control signal, mitigating the need to unwind the programmable filter over many reference clock periods.

Figure 12:
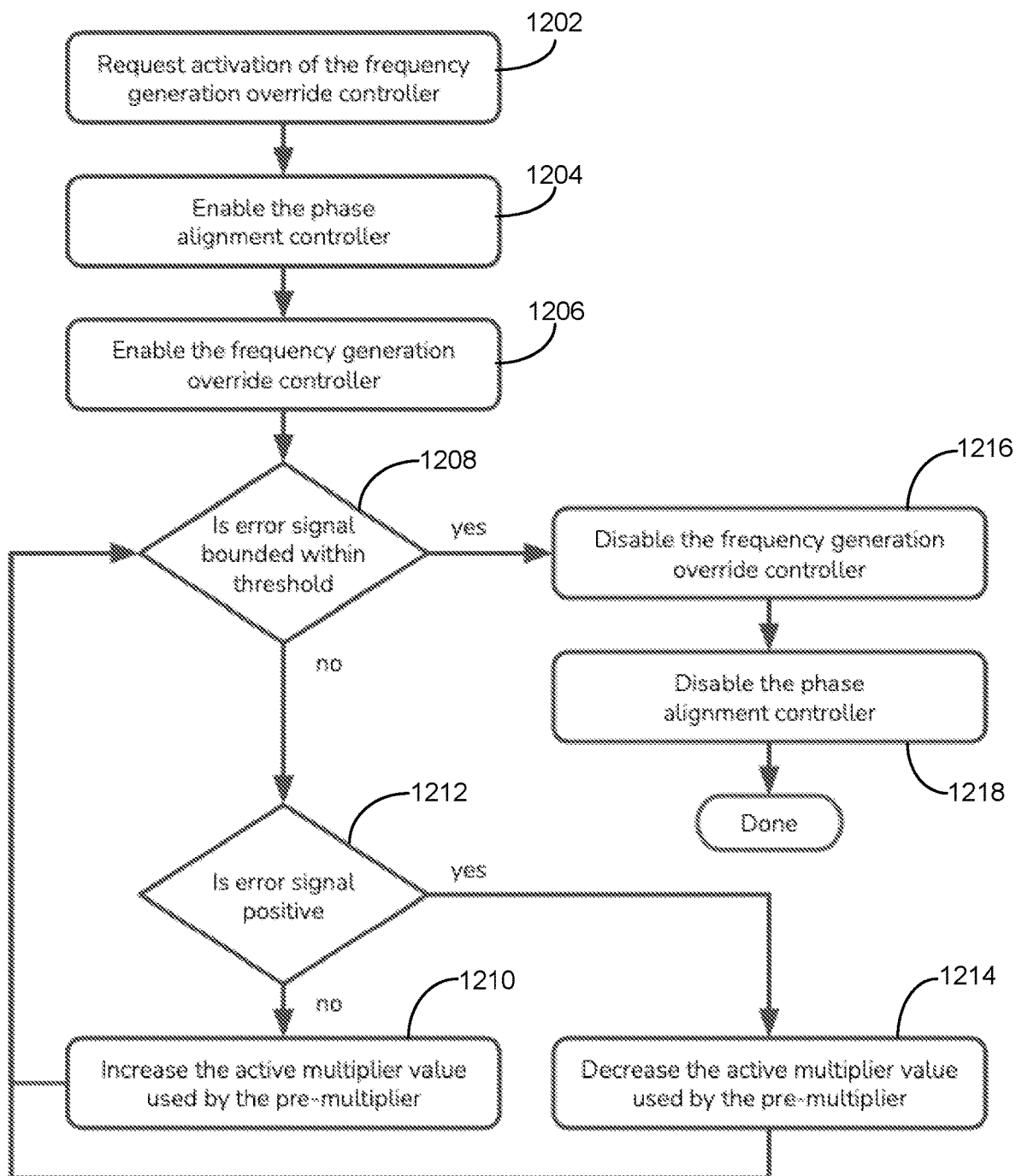
FIG. 12 illustrates method steps for operation of the PLL circuit of FIG. 8 utilizing the frequency generator override controller, the phase alignment controller and the pre-multiplier controller of FIG. 8.

FIG. 12 illustrates steps involved during operation of a frequency multiplier circuit that employs a programmable transition controller 120 that includes a frequency generator override controller 802, a phase alignment controller 502, and a pre-multiplier controller 222, all shown in FIG. 8. Operation begins by requesting activation of the frequency generation override controller 802, at 1202. This request can be sent through programming settings or control pins. Upon receiving the activation request, both the phase alignment controller 502 and the frequency generation override controller 802 are enabled, at 1204 and 1206. The frequency generation override controller 802 will then iterate over the sequence of override control values using both the control transition settings and the target control settings to determine the sequence of override control values. The phase alignment controller 502 will use the programmed filter settings, Coefficients, to determine how to inject the active error back into the pre-multiplier.

Further referring to FIG. 12, after the frequency generation override controller 802 has reached the target override value, the programmable transition controller 120 will search over the pre-multiplier values until finding the pre-multiplier value that corresponds to the target override control value applied to the frequency generation circuit 800. The system first checks whether the error signal is bounded within the programmable threshold, at 1208. If not, the multiplier is increased, at 1210, when the error signal is determined, at 1212, to be negative, and decreased, at 1214, when the error signal is positive. The system then repeats the process of measuring the error signal, at 1208, and adjusting the multiplier value until the error signal is bounded. Once the error signal is bounded, the programmable transition controller 120 will disable both the frequency generation override controller 802 and the phase alignment controller 502, at 1216 and 1218. With both the frequency generation override controller 802 and the phase alignment controller 502 disabled, the core frequency multiplier circuit will resume normal operation and will drive the output frequency back to the multiplication ratio set within the pre-multiplier. Since the search algorithm has deduced the pre-multiplier value that corresponds to the current frequency generation circuit control value, the system will only need to make a very minor correction. The magnitude of this correction can be controlled by tightening, or widening, the error threshold value.

Further referring to FIG. 12, in order to stabilize the feedback loop to the new frequency before the frequency generator override controller 802 is deactivated, at 1216, the phase alignment controller 502 and the pre-multiplier controller 222 are used to drive the error signal back to zero. First, the phase alignment controller 502 continuously injects a portion of the error signal back into the pre-multiplied digital representation of the reference frequency and phase. This ensures that a portion of the error is continuously zeroed out between the pre-multiplied digital representation of the reference frequency and phase and the digital representation of the output frequency and phase. Secondly, a portion of the error signal is fed back into the updated transfer function, M(z), within the pre-multiplier to adjust the update transfer function, M(z). When the error signal tracks close to zero, the pre-multiplier update transfer function, M(z) will stabilize to the value which represents the actual ratio of reference frequency and phase to output frequency and phase being generated by the override control signal. Once the multiplier search algorithm is executed, the programmable transition controller 120 can be deactivated, and the loop will hold at the new frequency and phase value generated at the end of the override frequency transition.

The frequency multiplier circuit embodiments described above lend themselves well to frequency transition applications that allow for fast transitions between changes in signal frequencies, with minimal overshoot/undershoot effects. In some situations, frequency divider circuits may beneficially expand the overall frequency range of the system. For systems employing post divider circuitry, a further technique in addition to or alternative to those described above, may be employed to smoothly transition between frequencies.

Figure 13:
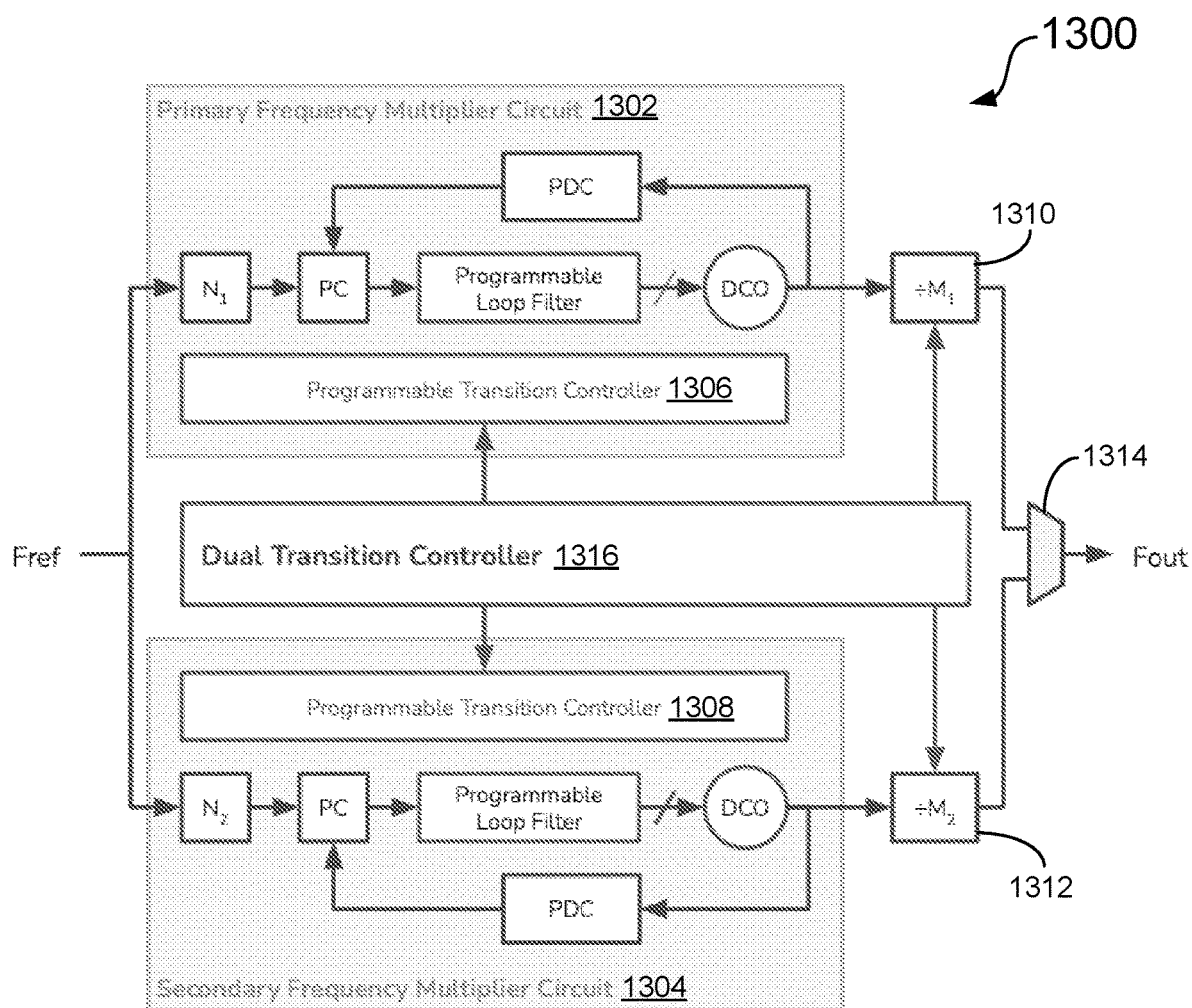
FIG. 13 illustrates one embodiment of a system that employs multiple clock generation circuits similar to the PLL circuit of FIG. 1.

FIG. 13 illustrates one embodiment of a frequency multiplier system 1300 that includes a first frequency multiplier circuit 1302 that is switchably coupled to a second frequency multiplier circuit 1304. Each of the frequency multiplier circuits 1302 and 1304 may take the form of any of the embodiments described above, with respective programmable transition controllers 1306 and 1308 to support programmable frequency transitions. First and second programmable post divider circuits 1310 and 1312 are disposed at the outputs of each frequency multiplier circuit 1302 and 1304. For some embodiments, the separate post-divider circuits 1310 and 1312 are configured with different frequency ranges. In some embodiments, the frequency ranges may be adjacent to each other such that a high boundary of one divider is next to a low boundary of the other divider. Switching circuitry 1314 selects between the respective post divider circuits 1310 and 1312 in response to a control signal generated by a dual transition controller 1316. In some embodiments, any number of frequency multiplier circuits may be switchably coupled to the switching circuitry 1314.

Further referring to FIG. 13, the dual transition controller 1316 includes circuitry to sequence a series of signals to accomplish a desired transition from one output frequency to a target output frequency. In some embodiments, the circuitry may pre-configure the post divider circuits 1310 and 1312 to exhibit different frequency ranges, such as adjacent ranges, or allow for the post divider circuits to be programmed on-the-fly during operation.

In operation, the system 1300 generally determines whether a given frequency transition for a given one of the frequency multiplier circuits crosses a post divider frequency range boundary, and switches to the other frequency multiplier circuit (which is pre-locked to a frequency range outside the post divider range boundary of the first frequency multiplier circuit). In switching between the frequency divider circuits based on a post divider frequency boundary crossing, frequency transitions that exceed a given frequency generation circuit range may be successfully carried out.

Figure 14:
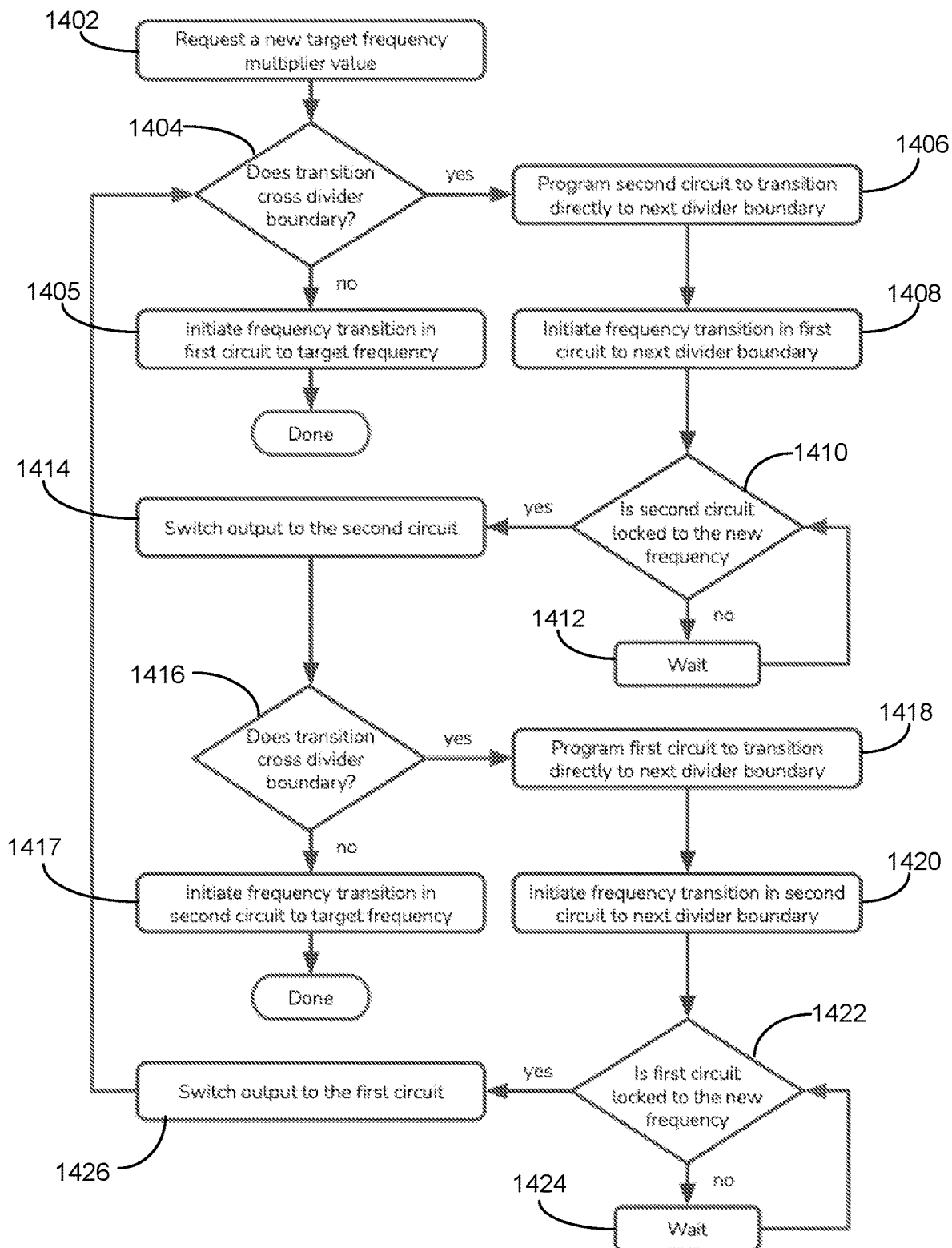
FIG. 14 illustrates method steps for operation of the system of FIG. 13.

FIG. 14 illustrates steps employed for one embodiment of a method of operation for the system 1300 of FIG. 13. At 1402, the system receives a request for a new target frequency multiplier value for the first one of the frequency multiplier circuits 1302, which becomes a primary frequency multiplier circuit. A determination is then made, at 1404, as to whether the transition crosses a frequency range boundary of the post divider circuit 1310 associated with the first frequency multiplier circuit 1302. If not, then the system initiates the frequency transition in the first frequency multiplier circuit 1302 to the target frequency, at 1405. If the transition crosses the associated post divider frequency range boundary, then the second frequency multiplier circuit 1304 is programmed, at 1406, to transition directly to the next post divider boundary. At 1408, the system initiates the frequency transition in the first frequency multiplier circuit 1302 to the next post divider boundary. A determination is then made, at 1410, as to whether the second frequency multiplier circuit 1304 is locked to the new frequency. If not, then the circuit waits, at 1412. If so, then the system switches its output to the second frequency multiplier circuit 1304, at 1414. The process then repeats, but with the second multiplier circuit 1304 taking the lead role as the primary multiplier circuit. Thus, at 1416, the system determines whether the frequency transition crosses the post divider frequency range boundary associated with the second post divider circuit 1312 of the second frequency multiplier circuit 1304. If not, then the system initiates the frequency transition in the second frequency multiplier circuit 1304 to the target frequency, at 1417. If the transition crosses the associated post divider frequency range boundary, then the first frequency multiplier circuit 1302 is programmed, at 1418, to transition directly to the next post divider boundary. At 1420, the system initiates the frequency transition in the second frequency multiplier circuit 1304 to the next post divider boundary. A determination is then made, at 1422, as to whether the first frequency multiplier circuit 1302 is locked to the new frequency. If not, then the circuit waits, at 1424. If so, then the system switches its output to the first frequency multiplier circuit, at 1426. In some circumstances, the process may iterate multiple cycles.

The system 1300 of FIG. 13 is thus capable of transitioning between frequencies that are outside the range of a DCO for a given one of the frequency multiplier circuits by alternatingly switching, or "ping-ponging" between frequency multiplier circuits that are pre-locked or programmed on-the-fly to the next divider boundary.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A frequency multiplier circuit, comprising:
    a forward signal path including
        a first multiplier circuit to receive a reference signal having a reference frequency and a reference phase and configured to generate a digital representation of the pre-multiplied reference frequency and reference phase as multiplied by an update transfer function;
        phase comparison circuitry to compare the digital representation of the pre-multiplied reference frequency and reference phase to a digital representation of an output signal having an output frequency and an output phase, the phase comparison circuitry to generate an error signal based on the comparison;
        a programmable loop filter to generate a control signal based at least in part on the error signal;
        a frequency generation circuit to produce the output signal having the output frequency and phase;
    a feedback path including a phase-to-digital converter coupled between the frequency generation circuit and the phase comparison circuitry to generate the digital representation of the output signal and feed the digital representation of the output signal to the phase comparison circuitry; and
    a programmable transition controller coupled to the forward signal path to control a transitioning frequency relationship between a first signal frequency of a first locked output signal and a desired second signal frequency.

2. The frequency multiplier circuit of claim 1, wherein:
    the transitioning frequency relationship between the first signal frequency and the desired second signal frequency is a linear relationship.

3. The frequency multiplier circuit of claim 1, wherein the programmable transition controller comprises:
    a pre-multiplier controller coupled to the first multiplier circuit and configured to continuously update a multiplication ratio between the reference frequency/reference phase and the output frequency/output phase.

4. The frequency multiplier circuit of claim 3, wherein the pre-multiplier controller further comprises:
    a multiplier updating circuit to generate a sequence of multiplier values based on a predefined multiplier transition characteristic.

5. The frequency multiplier circuit of claim 3, wherein the programmable transition controller further comprises:
    a phase alignment controller coupled to the first multiplier circuit and the phase comparison circuitry to continuously align the digital representation of the output frequency and phase to the digital representation of the pre-multiplied reference frequency and phase.

6. The frequency multiplier circuit of claim 5, wherein the phase alignment controller further comprises:
    a threshold measurement circuit that returns a status signal indicating whether the error signal is bounded within a programmable threshold; and
    a programmable filter circuit configured to provide an adjustment signal to the phase comparison circuitry based on a value of the error signal.

7. The frequency multiplier circuit of claim 6, wherein the programmable filter circuit comprises:
    a finite impulse response (FIR) filter having configurable tap weight settings.

8. The frequency multiplier circuit of claim 1, wherein the programmable transition controller comprises:
    a frequency generator override controller coupled to the programmable loop filter to selectively override the programmable loop filter control signal with an override control signal, the override control signal generated, based in part, on a desired frequency transition characteristic between the first signal frequency and the desired second signal frequency.

9. The frequency multiplier circuit of claim 8, wherein the programmable transition controller further comprises:
a phase alignment controller coupled to the first multiplier circuit and the phase comparison circuitry to continuously align the digital representation of the output frequency and phase to the digital representation of the pre-multiplied reference frequency and phase.

10. The frequency multiplier circuit of claim 9, wherein the programmable transition controller further comprises:
a pre-multiplier controller coupled to the first multiplier circuit and configured to continuously update a multiplication ratio between the reference frequency/reference phase and the output frequency/output phase.

11. A method of operating a frequency multiplier circuit, comprising:
receiving a reference signal having a reference frequency and a reference phase;
generating a digital representation of the reference frequency and reference phase;
multiplying the digital representation of the reference frequency and reference phase by a first multiplier value;
comparing the digital representation of the reference frequency and reference phase to a digital representation of an output signal having an output frequency and an output phase, and generating an error signal based on the comparison;
producing a control signal based at least in part on the error signal;
generating in response to the control signal, with a frequency generation circuit, the output signal having the output frequency and phase;
generating the digital representation of the output signal and feeding back the digital representation of the output signal to the phase comparison circuitry; and
programmably controlling a transitioning frequency relationship between a first signal frequency and a desired second signal frequency.

12. The method of claim 11, wherein the programmably controlling the transitioning frequency relationship between the first signal frequency and the desired second signal frequency comprises:
linearly ramping the output signal from the first signal frequency to the desired second frequency in accordance with a predefined rate.

13. The method of claim 11, wherein the programmably controlling the transitioning frequency relationship between the first signal frequency and the desired second signal frequency comprises:
continuously updating a multiplication ratio between the reference frequency/reference phase and the output frequency/output phase with a sequence of multiplier values based on a predefined multiplier transition characteristic.

14. The method of claim 11, wherein the programmably controlling the transitioning frequency relationship between the first signal frequency and the desired second signal frequency comprises:
continuously aligning the digital representation of the output frequency and phase to the digital representation of the pre-multiplied reference frequency and phase.

15. The method of claim 11, wherein the programmably controlling the transitioning frequency relationship between the first signal frequency and the desired second signal frequency comprises:
selectively overriding the programmable loop filter control signal with an override control signal, the override control signal generated, based in part, on a desired frequency transition characteristic between the first signal frequency and the desired second signal frequency.

16. A phase-locked loop (PLL) circuit, comprising:
a first multiplier circuit to generate a first digital value representing a received reference signal having a reference frequency and reference phase, the multiplier circuit to multiply the first digital value by a multiplier value;
comparison circuitry to compare the first digital value to an output digital value representing an output signal having an output frequency and an output phase, the comparison circuitry to generate an error signal based on the comparison;
a programmable loop filter to generate a control signal based at least in part on the error signal;
a frequency generation circuit to produce the output signal having the output frequency and phase;
a phase-to-digital converter coupled between the frequency generation circuit and the comparison circuitry to generate the output digital value and feed the output digital value to the comparison circuitry; and
a programmable transition controller to control a transitioning frequency relationship between a first signal frequency of a first locked output signal and a desired second signal frequency.

17. The PLL of claim 16, wherein:
the transitioning frequency relationship between the first signal frequency and the desired second signal frequency is a linear relationship.

18. The PLL of claim 17, wherein the programmable transition controller further comprises:
a pre-multiplier controller coupled to the first multiplier circuit and configured to continuously update a multiplication ratio between the reference frequency/reference phase and the output frequency/output phase.

19. The PLL of claim 17, wherein the programmable transition controller further comprises:
a phase alignment controller coupled to the first multiplier circuit and the phase comparison circuitry to continuously align the digital representation of the output frequency and phase to the digital representation of the pre-multiplied reference frequency and phase.

20. The PLL of claim 17, wherein the programmable transition controller comprises:
a frequency generator override controller coupled to the programmable loop filter to selectively override the programmable loop filter control signal with an override control signal, the override control signal generated, based in part, on a desired frequency transition characteristic between the first signal frequency and the desired second signal frequency.

* * * * *